United States Patent
Nguyen

(10) Patent No.: US 7,406,572 B1
(45) Date of Patent: Jul. 29, 2008

(54) UNIVERSAL MEMORY CIRCUIT ARCHITECTURE SUPPORTING MULTIPLE MEMORY INTERFACE OPTIONS

(75) Inventor: Simon B. Nguyen, Poway, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 249 days.

(21) Appl. No.: 11/069,499

(22) Filed: Mar. 1, 2005

Related U.S. Application Data

(60) Provisional application No. 60/556,970, filed on Mar. 26, 2004.

(51) Int. Cl.
*G06F 13/36* (2006.01)
(52) U.S. Cl. .................. 711/154; 711/107; 711/202
(58) Field of Classification Search .................. 711/107, 711/101, 167, 202, 154
See application file for complete search history.

(56) References Cited

U.S. PATENT DOCUMENTS

| | | | | |
|---|---|---|---|---|
| 5,640,536 | A | * | 6/1997 | King et al. ............... 703/23 |
| 5,928,347 | A | * | 7/1999 | Jones ..................... 710/305 |
| 6,047,361 | A | * | 4/2000 | Ingenio et al. ........... 711/167 |
| 6,404,671 | B1 | * | 6/2002 | Reohr et al. ............. 365/158 |
| 6,434,660 | B1 | * | 8/2002 | Lambert et al. .......... 711/103 |
| 6,795,906 | B2 | | 9/2004 | Matsuda |
| 2002/0095280 | A1 | | 7/2002 | Tung et al. |
| 2002/0147882 | A1 | | 10/2002 | Pua et al. |
| 2003/0041203 | A1 | * | 2/2003 | Jones et al. ............. 710/301 |
| 2003/0043624 | A1 | | 3/2003 | Roohparvar et al. |
| 2003/0067814 | A1 | | 4/2003 | Piau et al. |
| 2004/0117688 | A1 | * | 6/2004 | Vainsencher et al. ........ 714/42 |
| 2004/0143693 | A1 | | 7/2004 | Hwang |
| 2004/0168015 | A1 | | 8/2004 | Roohparvar et al. |
| 2004/0193782 | A1 | | 9/2004 | Bordui |
| 2005/0060464 | A1 | * | 3/2005 | Alva et al. .............. 710/300 |
| 2005/0060465 | A1 | * | 3/2005 | Wyatt et al. ............. 710/300 |

OTHER PUBLICATIONS

U.S. Appl. No. 10/927,980 entitled "Universal Memory Architecture with MRAM," filed Aug. 27, 2004.

* cited by examiner

*Primary Examiner*—Kevin L. Ellis
*Assistant Examiner*—Kenneth M Lo
(74) *Attorney, Agent, or Firm*—Kevin L. Daffer; Daffer McDaniel, LLP

(57) ABSTRACT

An architecture for an improved non-volatile memory device supporting multiple memory interface options is disclosed herein. In one embodiment, the improved memory device includes a magnetic random access memory (MRAM) array and at least one memory interface block, which is configured for accessing a different type of memory array other than the MRAM array. A smart MRAM interface block is also included and coupled between the plurality of memory interface blocks and the MRAM array. The smart MRAM array is configured for accessing the MRAM array using commands intended for the MRAM array, as well as commands intended for the different type of memory array. A method for operating the improved non-volatile memory device is also disclosed herein.

25 Claims, 5 Drawing Sheets

| CMD[1:0] | W/R | Description |
| --- | --- | --- |
| CMD[00] | W/R | Set both pins low to enable auto-increment function for data read or write cycles |
| CMD[01] | W/R | Write cycle: latch the LSBs of the address<br>Read cycle: return ID data from the ID Reg. |
| CMD[10] | W/R | Write cycle: latch the MSBs of the address<br>Read cycle: TBD |
| CMD[11] | W/R | Write cycle: send Commands to the chip<br>Read cycle: return Status data from Status Reg. |

| RPC16 | PIN | RPC MRAM Description |
|---|---|---|
| NC | 1 | No Connect |
| GND | 2 | Ground |
| RE# | 3 | Read Enable |
| CE# | 4 | Chip Enable |
| VCC | 5 | Power |
| GND | 6 | Ground |
| CMD0 | 7 | Command Bit 0 |
| CMD1 | 8 | Command Bit 1 |
| WE# | 9 | Write Enable |
| WP# | 10 | Write Protect |
| GND | 11 | Ground |
| IO1 | 12 | I/O port |
| IO9 | 13 | I/O port |
| IO2 | 14 | I/O port |
| IO10 | 15 | I/O port |
| IO3 | 16 | I/O port |
| IO11 | 17 | I/O port |
| IO4 | 18 | I/O port |
| IO12 | 19 | I/O port |
| VCC | 20 | Power |
| IO5 | 21 | I/O port |
| IO13 | 22 | I/O port |
| IO6 | 23 | I/O port |
| IO14 | 24 | I/O port |
| IO7 | 25 | I/O port |
| IO15 | 26 | I/O port |
| IO8 | 27 | I/O port |
| GND | 28 | Ground |

*FIG. 4*

| RPC32 | PIN | RPC32 MRAM Description |
|---|---|---|
| NC | 1 | No Connect |
| IO31 | 2 | I/O port |
| IO30 | 3 | I/O port |
| IO29 | 4 | I/O port |
| IO28 | 5 | I/O port |
| GND | 6 | Ground |
| NC | 7 | No Connect |
| RE# | 8 | Read Enable |
| CE# | 9 | Chip Enable |
| IO27 | 10 | I/O port |
| IO26 | 11 | I/O port |
| VCC | 12 | Power |
| GND | 13 | Ground |
| IO25 | 14 | I/O port |
| IO24 | 15 | I/O port |
| CMD0 | 16 | Command Bit0 |
| CMD1 | 17 | Command Bit1 |
| WE# | 18 | Write Enable |
| WP# | 19 | Write Protect |
| IO23 | 20 | I/O port |
| IO22 | 21 | I/O port |
| IO21 | 22 | I/O port |
| IO20 | 23 | I/O port |
| IO19 | 24 | I/O port |
| GND | 25 | Ground |
| IO18 | 26 | I/O port |
| IO17 | 27 | I/O port |
| IO16 | 28 | I/O port |
| IO1 | 29 | I/O port |
| IO2 | 30 | I/O port |
| IO3 | 31 | I/O port |
| IO4 | 32 | I/O port |
| NC | 33 | No Connect |
| IO12 | 34 | I/O port |
| IO13 | 35 | I/O port |
| IO14 | 36 | I/O port |
| VCC | 37 | Power |
| IO15 | 38 | I/O port |
| NC | 39 | No Connect |
| NC | 40 | No Connect |
| IO5 | 41 | I/O port |
| IO6 | 42 | I/O port |
| IO7 | 43 | I/O port |
| IO8 | 44 | I/O port |
| IO9 | 45 | I/O port |
| IO10 | 46 | I/O port |
| IO11 | 47 | I/O port |
| GND | 48 | Ground |

*FIG. 5*

| CF | RPC32 | RPC16 | PIN | X8 | X16 | X32 | NAND Flash Description |
|---|---|---|---|---|---|---|---|
| CD1 | VSS | VSS | 1 | NC | NC | VSS | No Connect/GND |
| IO15 | IO31 | | 2 | NC | NC | IO31 | No Connect |
| IO14 | IO30 | | 3 | NC | NC | IO30 | |
| IO13 | IO29 | | 4 | NC | NC | IO29 | |
| IO12 | IO28 | | 5 | NC | NC | IO28 | |
| GND | GND | GND | 6 | GND | GND | GND | Ground |
| READY | | | 7 | RY/BY# | RY/BY# | RY/BY# | Ready/Busy |
| IORD | RE# | RE# | 8 | RE# | RE# | RE# | Read Enable |
| CE1 | CE# | CE# | 9 | CE# | CE# | CE# | Chip Enable |
| IO11 | IO27 | | 10 | NC | NC | IO27 | |
| IO10 | IO26 | | 11 | NC | NC | IO26 | |
| VCC | VCC | VCC | 12 | VCC | VCC | VCC | Power |
| VSS | VSS | VSS | 13 | VSS | VSS | VSS | Ground |
| IO09 | IO25 | | 14 | NC | NC | IO25 | |
| IO08 | IO24 | | 15 | NC | NC | IO24 | |
| BVD2 | CMD0 | CMD0 | 16 | CLE | CLE | CLE | Command Latch Enable |
| BVD1 | CMD1 | CMD1 | 17 | ALE | ALE | ALE | Address Latch enable |
| IOWR | WE# | WE# | 18 | WE# | WE# | WE# | Write Enable |
| WP# | WP# | WP# | 19 | WP# | WP# | WP# | Write Protect |
| IO07 | IO23 | | 20 | NC | NC | IO23 | |
| IO06 | IO22 | | 21 | NC | NC | IO22 | |
| IO05 | IO21 | | 22 | NC | NC | IO21 | |
| IO04 | IO20 | | 23 | NC | NC | IO20 | |
| IO03 | IO19 | | 24 | NC | NC | IO19 | |
| VSS | VSS | VSS | 25 | NC | VSS | VSS | |
| IO02 | IO18 | IO1 | 26 | NC | IO1 | IO18 | I/O port |
| IO01 | IO17 | IO9 | 27 | NC | IO9 | IO17 | I/O port |
| IO00 | IO16 | IO2 | 28 | NC | IO2 | IO16 | I/O port |
| A0 | IO1 | IO10 | 29 | IO1 | IO10 | IO1 | I/O port |
| A1 | IO2 | IO3 | 30 | IO2 | IO3 | IO2 | I/O port |
| A2 | IO3 | IO11 | 31 | IO3 | IO11 | IO3 | I/O port |
| A3 | IO4 | IO4 | 32 | IO4 | IO4 | IO4 | |
| A4 | | IO12 | 33 | NC | IO12 | NC | |
| A5 | IO12 | | 34 | NC | NC | IO12 | |
| A6 | IO13 | | 35 | NC | NC | IO13 | |
| A7 | IO14 | | 36 | VSS | NC | IO14 | |
| VCC | VCC | VCC | 37 | VCC | VCC | VCC | Power |
| A8 | IO15 | | 38 | NC | NC | IO15 | |
| A9 | | | 39 | NC | NC | NC | |
| A10 | | IO5 | 40 | NC | IO5 | NC | I/O port |
| CE2 | IO5 | IO13 | 41 | IO5 | IO13 | IO5 | I/O port |
| CSEL | IO6 | IO6 | 42 | IO6 | IO6 | IO6 | I/O port |
| VS2 | IO7 | IO14 | 43 | IO7 | IO14 | IO7 | I/O port |
| RESET | IO8 | IO7 | 44 | IO8 | IO7 | IO8 | I/O port |
| WAIT | IO9 | IO15 | 45 | NC | IO15 | IO9 | I/O port |
| INPACK | IO10 | IO8 | 46 | NC | IO8 | IO10 | |
| REG | IO11 | | 47 | NC | NC | IO11 | |
| VSS | VSS | VSS | 48 | NC | VSS | VSS | |

*FIG. 6*

| PIN | X16 | NOR Flash Description |
|---|---|---|
| 1 | A15 | Address pin 15 |
| 2 | A14 | Address pin 14 |
| 3 | A13 | Address pin 13 |
| 4 | A12 | Address pin 12 |
| 5 | A11 | Address pin 11 |
| 6 | A10 | Address pin 10 |
| 7 | A9 | Address pin 9 |
| 8 | A8 | Address pin 8 |
| 9 | A19 | Address pin 19 |
| 10 | WE# | Write Enable |
| 11 | NC | No Connect |
| 12 | RESET# | Hardware RESET input |
| 13 | NC | |
| 14 | NC | |
| 15 | RY/BY# | Ready/Busy Output |
| 16 | A18 | Address pin 18 |
| 17 | A17 | Address pin 17 |
| 18 | A7 | Address pin 7 |
| 19 | A6 | Address pin 6 |
| 20 | A5 | Address pin 5 |
| 21 | A4 | Address pin 4 |
| 22 | A3 | Address pin 3 |
| 23 | A2 | Address pin 2 |
| 24 | A1 | Address pin 1 |
| 25 | A0 | Address pin 0 |
| 26 | CE# | Chip Enable Input |
| 27 | VSS | Ground |
| 28 | OE# | Output Enable Input |
| 29 | D0 | Data bit 0 |
| 30 | D8 | Data bit 8 |
| 31 | D1 | Data bit 1 |
| 32 | D9 | Data bit 9 |
| 33 | D2 | Data bit 2 |
| 34 | D10 | Data bit 10 |
| 35 | D3 | Data bit 3 |
| 36 | D11 | Data bit 11 |
| 37 | VCC | Power |
| 38 | D4 | Data bit 4 |
| 39 | D12 | Data bit 12 |
| 40 | D5 | Data bit 5 |
| 41 | D13 | Data bit 13 |
| 42 | D6 | Data bit 6 |
| 43 | D14 | Data bit 14 |
| 44 | D7 | Data bit 7 |
| 45 | D15 | Data bit 15 |
| 46 | VSS | Ground |
| 47 | BYTE# | Word/Byte Select |
| 48 | A16 | Address pin 16 |

*FIG. 7*

UNIVERSAL MEMORY CIRCUIT ARCHITECTURE SUPPORTING MULTIPLE MEMORY INTERFACE OPTIONS

PRIORITY APPLICATION

This application claims priority to provisional application No. 60/556,970 entitled "Multi-Function Magnetic Random Access Memory (MRAM) Device" filed Mar. 26, 2004.

BACKGROUND OF THE INVENTION

1. Field of the Invention

The present invention generally relates to electronic circuits, and more specifically, to a memory circuit architecture including a magnetic random access memory (MRAM) array and a smart memory interface block. The smart memory interface block is uniquely configured for accessing the MRAM array using commands intended for the MRAM array, as well as commands intended for a different type of memory.

2. Description of the Related Art

The following descriptions and examples are not admitted to be prior art by virtue of their inclusion within this section.

Numerous types of semiconductor memory are currently available in the marketplace today. Though an array of storage elements is commonly included within each type of memory, the storage elements of different memory types often differ in both architecture and function. For example, a memory storage element can be volatile or non-volatile. Types of volatile memory include memory that must be periodically refreshed (e.g., DRAM) or memory that will lose its programmed state if power is removed from the memory circuit (e.g., SRAM). Unlike volatile memory, however, non-volatile memory is able to maintain its stored contents when power is removed from the memory circuit. Types of non-volatile memory include read-only memory (such as ROM, PROM, EPROM and EEPROM), magnetic random access memory (MRAM), battery-backed SRAM (BBSRAM) and Flash memory.

In some cases, a system designer may include more than one type of memory device within a given product or system to accommodate different memory functions. In other cases, the system designer may use different types of memory in different products or systems. For example, a system designer may include a static random access memory (SRAM) device within a system to provide efficient, low capacity storage caching. In addition, the system designer may include a Flash memory device within the same system, or within a completely different system, for non-volatile, high capacity storage caching. Therefore, system designers and/or manufactures must often maintain an inventory of each type of memory device they tend to use. This is both costly and inconvenient, especially since the design, manufacture and/or overhead costs associated with each type of memory device could be on the order of $1 M, or more.

In some cases, the costs associated with upgrading a circuit or system may also be prohibitively expensive for the manufacturer. For example, system board layouts are typically designed with a particular memory product(s) in mind. After selecting one or more types of memory devices to be used in a system, the system designer selects an appropriate memory interface circuit and designs a board layout to accommodate the selected type(s) of memory. Later, if the designer wants to change the type of memory used, he/she must redesign the board or change the memory interface on the board to accommodate the new type of memory. This is a major inconvenience for the system designer and may increase the time-to-market for the system, as well as the costs associated with the overall design/manufacturing process. For example, as mask costs continue to grow, the cost of even a single mask change becomes significant, thereby facilitating the desire to reduce or altogether avoid mask changes.

For at least these reasons, it would be desirable to provide a non-volatile memory device that can be used as a drop-in replacement for one or more different types of memory devices. Such a memory device would reduce the costs associated with designing, manufacturing and maintaining an inventory of different memory products, as well as the costs incurred when upgrading a system to include a new memory device. The improved memory device could then be incorporated into existing system designs without requiring hardware/software changes to be made to the system layout or operation.

SUMMARY OF THE INVENTION

A universal memory architecture that can be used as a drop-in replacement for conventional memory devices is described herein. For example, the universal memory architecture may be configured to emulate one or more conventional memory products by incorporating one or more conventional memory interface blocks into a single memory product including a magnetic random access memory (MRAM) array. A smart MRAM interface block may also be included for accessing the MRAM array using commands intended for the MRAM array, as well as commands intended for one of the conventional memory products. Thus, the universal memory architecture may be configured to operate as a conventional memory product using a conventional interface, or as an improved MRAM device using the smart MRAM interface. The configuration could be performed during manufacturing by using bonding options to select a particular memory interface and input/output (I/O) pin configuration for emulating a particular memory product. Alternatively, the configuration could be performed dynamically via software/hardware control to select a desired interface and I/O pin configuration.

According to one embodiment of the invention, the memory circuit architecture described herein may include a magnetic random access memory (MRAM) array and a plurality of memory interface blocks, each configured for accessing a different type of memory array. For example, the plurality of memory interface blocks may include a smart MRAM interface and at least one additional memory interface block selected from a group comprising: a NAND Flash interface, a NOR Flash interface, a Compact Flash (CF) interface, and various types of Random Access Memory (RAM) and Read Only Memory (ROM) interfaces. Unlike conventional memory interfaces, the smart MRAM interface may be uniquely configured for: (i) using a first set of commands received by the memory circuit architecture to access the MRAM array, and (ii) translating a second set of commands received by the memory circuit architecture into a format recognized by the MRAM array before using the translated commands to access the MRAM array.

BRIEF DESCRIPTION OF THE DRAWINGS

Other objects and advantages of the invention will become apparent upon reading the following detailed description and upon reference to the accompanying drawings in which:

FIG. 4 is a table illustrating an exemplary input/output (I/O) pin configuration for a 28-pin MRAM package with an optional RPC16 (i.e., 16-pin reduced pin count) configuration;

FIG. 5 is a table illustrating an exemplary I/O pin configuration for a 48-pin MRAM package with an optional RPC32 (i.e., 32-pin reduced pin count) configuration;

FIG. 6 is a table illustrating an exemplary I/O pin configuration for a 48-pin NAND Flash memory interface with 8-bit, 16-bit and 32-bit data path capability, including RPC16, RPC32 and Compact Flash (CF) configurations; and FIG. 7 is a table illustrating an exemplary I/O pin configuration for a 48-pin NOR Flash memory interface with a 16-bit data path.

Figures 1, 3:
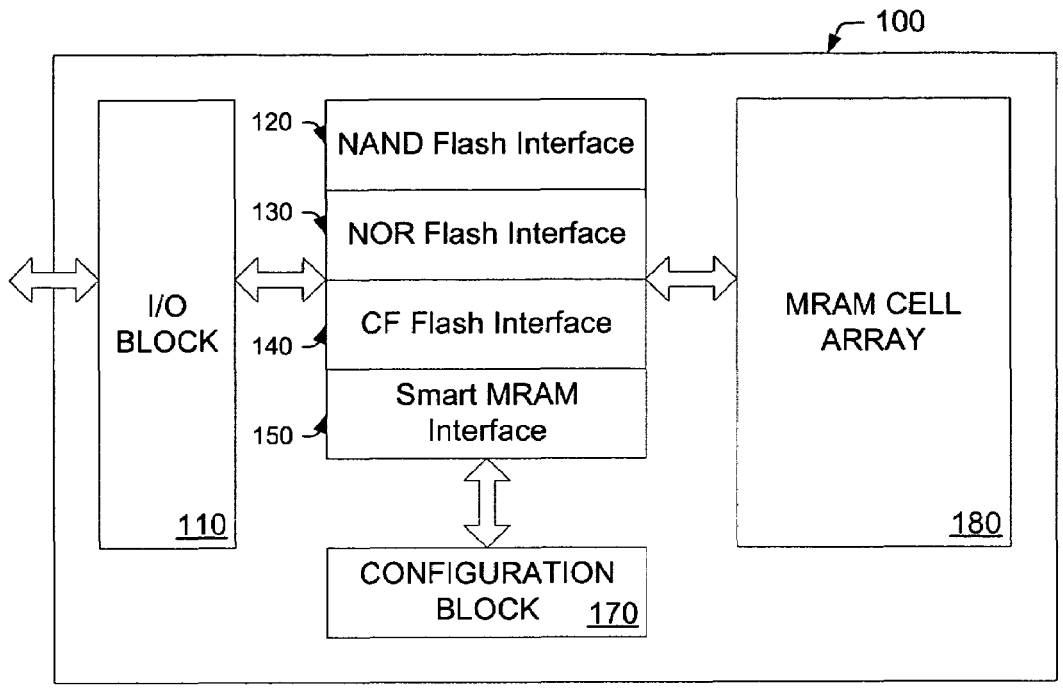
FIG. 1 is a block diagram of a universal memory circuit architecture, according to one embodiment of the invention.
FIG. 3 is a table illustrating one manner in which command sequencing bits [CMD<1:0>] may be used to provide extending addressing.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Non-volatile memory is widely used in personal digital assistants (PDAs), mobile phones, toys, digital imaging applications, music players, hand-held navigation devices, electronic books, and more. For example, Flash memory devices (such as NAND Flash, NOR Flash and Compact Flash) are often used for non-volatile storage in many of the above-mentioned applications, as well as other electronic devices and systems. Like most semiconductor memory, each Flash memory device may generally include an array of storage elements. However, the storage elements included within different types of Flash memory may differ in both architecture and function, and therefore, may include substantially different memory interface blocks for coordinating access to/from their respective storage elements.

In some cases, one or more types of Flash memory may be incorporated into a system design. The type of memory used is typically determined during the design/test stages, and generally cannot be modified by a user of the system. In addition, cost and time constraints may prohibit the system designer from changing or upgrading a memory device, which was originally included within a system design, to a different type of memory. Such constraints may influence the system designer to tolerate the inherent limitations of conventional Flash memory devices, even though better suited or better performing memory devices may currently exist, or exist sometime in the future.

For example, recent advancements in the use of magneto-resistive materials have progressed the development of magnetic random access memory (MRAM) devices to function as viable non-volatile memory circuits. In general, MRAM devices exploit the electromagnetic properties of magneto-resistive materials to set and maintain information stored within individual magnetic memory cell junctions of the circuit. The capabilities of MRAM make the device ideal for nonvolatile memory applications requiring frequent and/or rapid writes in a byte-wide or word-wide environment. For example, MRAM technology offers reliable operation across wide voltage ranges with inherent nonvolatility. MRAM devices also provide faster write cycles with higher write cycle endurance and higher reliability than other types of nonvolatile memory.

More specifically, MRAM devices may offer higher reliability and eliminate the inherent disadvantages and system design complexities typically associated with conventional memory devices, such as Flash memory, battery-backed static random access memory (BBSRAM), dynamic random access memory (DRAM) and electrically erasable programmable read-only memory (EEPROM). For example, in contrast to BBSRAM devices, MRAM devices do not require a battery or a separate power monitoring circuit. In addition, MRAM devices offer a monolithic nonvolatile memory, and thus, eliminate the multiple assemblies, connectors, modules, field maintenance and environmental issues common to BBSRAM devices.

Furthermore, unlike EEPROM and Flash memory, MRAM devices do not perform a background write or require data to be erased before programming. Instead, the entire memory operation may occur in a single bus cycle, thereby enabling a read or write operation to occur immediately following a write. As a result, the inherently fast write cycle time of MRAM devices may significantly reduce chip programming time, as compared to EEPROM and Flash memories. In addition, DRAM and Flash memory cells utilize storage elements (e.g., capacitors and transistors), which must be refreshed to maintain stored contents (DRAM capacitors) or are simply known for their unreliability (Flash transistors). MRAM cells, on the other hand, use magnetic direction to represent a logic "0" or logic "1" and, thus, are inherently more reliable than conventional DRAM and Flash memory devices. Furthermore, MRAM devices tend to be physically smaller than Flash memory architectures of similar densities (i.e., a similar number of memory cells), and therefore, may provide significant board real estate savings.

To overcome the limitations of conventional memory devices and/or to reduce the design, manufacture and overhead costs associated with multiple memory products, the present invention provides an improved non-volatile memory device, which consolidates multiple memory products within a single package. For example, the improved non-volatile memory device may include an MRAM array and a smart MRAM interface for accessing the MRAM array. In addition, the improved memory device may include at least one additional memory interface configured for accessing a substantially different type of memory array than the memory array (i.e., MRAM) actually included within the memory device. As described in more detail below, the signals intended for accessing the non-existent memory array (via the additional memory interface) may be translated by the smart MRAM interface to access the MRAM array. In this manner, the improved non-volatile memory device may provide a universal memory circuit architecture, which can be used to replace numerous single-function memory products by supporting a plurality of different memory interface options.

In some cases, the improved non-volatile memory device may include one or more conventional memory interface blocks selected from a group comprising, but not limited to, a NAND Flash interface, a NOR Flash interface, a Compact Flash interface and various types of RAM (e.g., SRAM, BBSRAM, DRAM, SDRAM, etc.) and ROM (e.g., ROM, PROM, EPROM, EEPROM, etc.) interfaces. Though the improved memory device may include substantially any number of conventional memory interfaces, the number of interfaces selected for use within a particular universal memory product may depend on design specifications, such as desired package size, memory capacity, power consumption and product flexibility, among others.

In some cases, the memory interfaces selected for use within a particular universal memory product may be chosen based on common interface properties. For example, NAND Flash, CF Flash, DRAM and SDRAM may be grouped for their ability to address larger memory spaces with a reduced number of pins, whereas SRAM, ROM, PROM, EEPROM and NOR Flash interfaces may be grouped for lacking such ability. One or more memory interfaces within a particular group may then be selected for use within the memory product. It is noted, however, that selection is not limited to only those groupings discussed above; any number and/or type of memory interface may be selected for use, as desired.

I. A UNIVERSAL MEMORY CIRCUIT ARCHITECTURE

An embodiment of an improved non-volatile memory device is shown in FIG. 1. In the illustrated embodiment, improved memory device 100 consolidates NAND Flash, NOR Flash and Compact Flash interfaces within a single memory chip design. More specifically, the conventional Flash interfaces are incorporated onto a die including an array of MRAM cells and a smart MRAM interface. Unlike conventional MRAM interfaces, the smart MRAM interface is uniquely configured to access the MRAM array using commands intended for the MRAM array, as well as commands intended for a NAND Flash, NOR Flash or Compact Flash memory device. Thus, the improved memory device may be configured to operate as one of the conventional Flash memory devices using a conventional interface, or as an improved MRAM device using the smart MRAM interface. Though conventional Flash interfaces are specifically used in the embodiment of FIG. 1, the inventive aspects described herein are not limited to Flash, and may additionally or alternatively include interfaces for other types of memory (such as various types of RAM or ROM).

As described in more detail below, memory architecture 100 may serve as a replacement for conventional MRAM and Flash memory devices. In other words, the memory architecture described herein provides a single memory chip (or "die") that can be used to replace conventional, single-function memory products with a multi-interface product that utilizes the benefits of MRAM technology (e.g., faster read/write cycles, increased reliability, reduced power consumption and programming complexity). By including conventional interfaces, memory architecture 100 may serve as a "plug & play" product, and may be used to replace the memory products originally included within a system layout, without making any changes to the existing system hardware or software.

It is noted, however, that memory architecture 100 is merely one embodiment of a memory architecture that may be used to replace conventional MRAM and Flash memory devices. Other layouts and configurations of components may alternatively be used. For example, memory architecture 100 may be additionally or alternatively configured for replacing other types of memory (such as various types of RAM or ROM). Consequently, the memory architecture described herein is not necessarily restricted to the architecture depicted in FIG. 1.

As shown in FIG. 1, memory architecture 100 may generally include an input/output (I/O) block (110), one or more conventional Flash memory interfaces (120, 130, 140), a smart MRAM interface (150), a configuration block (170) and an MRAM cell array (180). The I/O block 110 is a general purpose I/O block having a plurality of I/O pins configurable as input, output or bi-directional data paths. I/O block 110 may include substantially any number of pins in accordance with the design specifications of the device (e.g., memory capacity, interface types, desired package size, etc.). Though not illustrated in FIG. 1, I/O block 110 may also include other memory related I/O components, such as data in drivers, sense amplifiers and I/O buffers, as needed.

Configuration block 170 may be configured for selectively activating at least one memory interface block for accessing the MRAM array. Activation may be performed by a manufacturer of the memory device during packaging, or by a user of the memory device sometime thereafter. In addition, the selected memory interface may be activated by hardwired or programmable means. In some cases, the type of memory interface(s) included within the memory device may determine the time frame and/or the means by which a chosen memory interface block can be activated. For example, an SRAM, ROM, EPROM or NOR Flash interface may be selectively activated by downbonding the appropriate connections during packaging. Downbonding is typically the most cost effective option and may be used when programmable means cannot be used to activate a particular interface (due, e.g., to the pin interface and lack of backward compatibility). On the other hand, the smart MRAM, NAND Flash or Compact Flash interfaces may be selectively activated via programmable means, such as programmable fuses or software control sequences. If interface selection is performed via software, the memory device may provide an extra degree of flexibility by supporting existing applications, as well as new applications.

Once an interface block is selected, all other Flash memory interfaces may be disabled or placed in a power down mode to reduce power consumption. Interface selection also enables configuration block 170 to operatively couple the I/O pins of I/O block 110 to the appropriate inputs of the selected interface. For example, each of the plurality of pins in I/O block 110 may be configured as input, output, bi-directional or tri-state. The plurality of pins may also be capable of supporting multiple electrical levels (e.g., TTL, CMOS, etc) with pull-up and pull-down support. When a particular interface block is selected, configuration block 170 may remap the I/O pins to ensure that the command, address and data signals supplied to I/O block 110 are relayed to the appropriate inputs of the selected memory interface. In some embodiments, configuration block 170 may include a software-implemented table for determining the appropriate mappings between the I/O pins of I/O block 110 and the selected interface block. Exemplary I/O pin configurations for MRAM interface 150 and Flash interfaces 120, 130, 140 are shown in FIGS. 4-7 and described in more detail below.

NAND Flash interface 120, NOR Flash interface 130 and Compact Flash (CF) interface 140 may each be implemented in a conventional manner. In other words, Flash interfaces 120, 130 and 140 may include all hardware/software components typically included within such interfaces. By including conventional interfaces, the present invention may significantly reduce the design time, complexity and cost associated with memory architecture 100. The use of conventional interfaces may also enable memory architecture 100 to be used as a drop-in replacement for existing memory products, e.g., by maintaining compatible I/O pin configurations.

In some cases, memory architecture 100 may be configured to emulate or replace a Flash memory device using one of the conventional Flash interfaces described above. For example, the command, address and I/O signals intended for accessing a Flash memory device may be routed from one of the Flash interfaces (120, 130, 140) to the smart MRAM interface 150. The smart MRAM interface 150 may then translate the Flash-related signals into a format recognized by MRAM cell array 180. In one example, the smart MRAM interface may include hardware and/or software-implemented logic for translating the Flash-related signals into MRAM compatible commands. An exemplary manner in which signals can be translated is described in more detail below in reference to FIG. 2.

In other cases, memory architecture 100 may be configured to operate as an improved MRAM device using the smart MRAM interface 150. For example, the command, address and I/O signals received by I/O block 110 may be used by MRAM interface 150 to access an addressed portion of MRAM cell array 180. As described in more detail below, MRAM interface 150 may be coupled for receiving the MRAM related signals over an 8-bit, 16-bit or 32-bit address/data bus. In some cases, MRAM interface 150 may utilize a special command sequencing mode to provide up to 64-bit addressing, which may enable the interface to access an addressable memory space of up to 4 Gigabytes (GB) or larger. Reduced pin count configurations (e.g., RPC16 and RPC32) are also provided for the smart MRAM interface and described in more detail below in reference to FIGS. 4 and 5. These configurations generally enable the interface to access the same amount of memory with a reduced number of I/O pins.

II. A SMART MRAM INTERFACE

Figure 2:
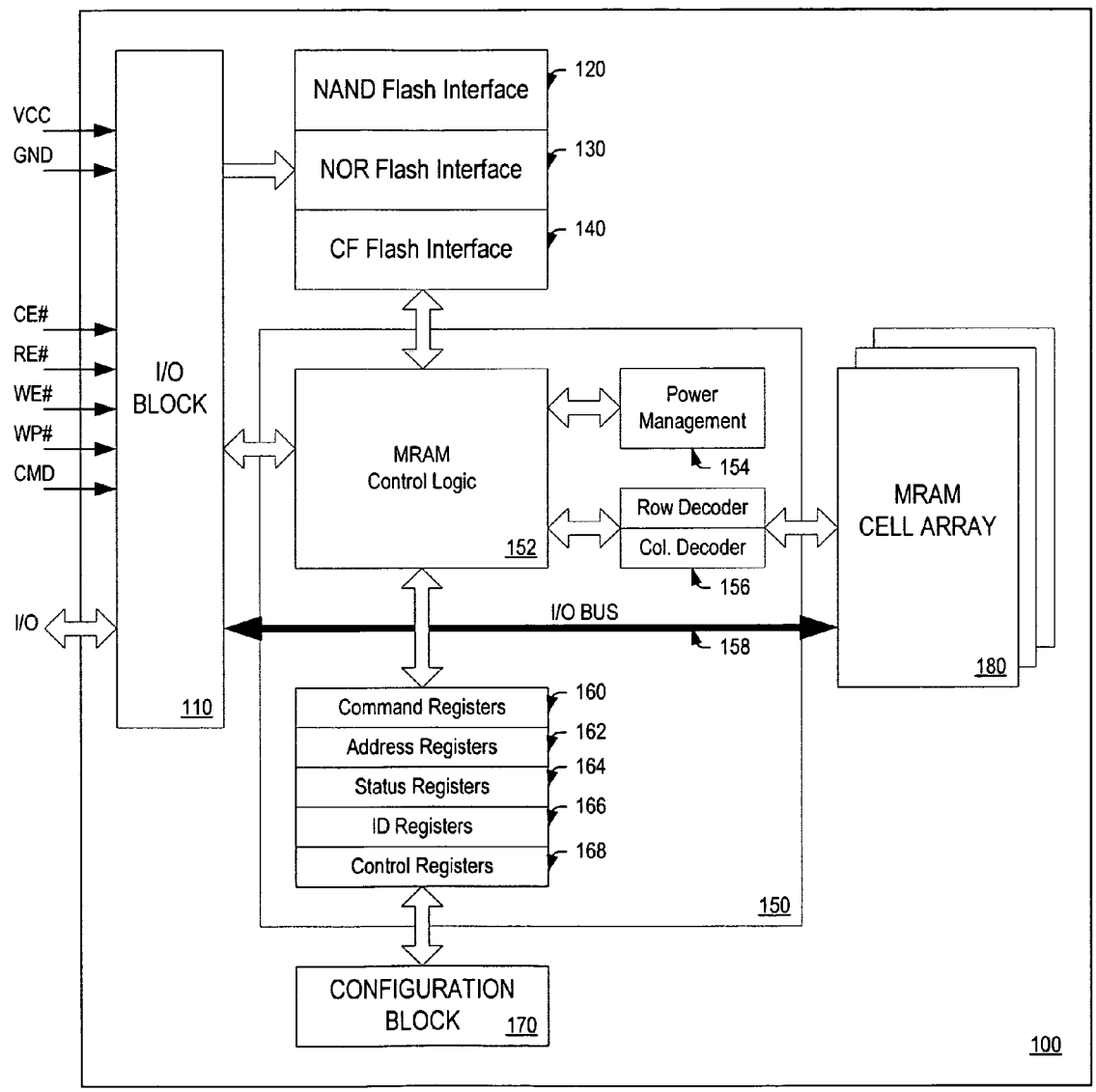
FIG. 2 is a block diagram illustrating the memory architecture of FIG. 1 in more detail.

FIG. 2 is a block diagram of memory architecture 100 illustrating smart MRAM interface 150 in more detail, according to one embodiment of the invention. As shown in FIG. 2, smart MRAM interface 150 may generally include MRAM control logic block 152, Power Management block 154, Row and Column Decoder blocks 156, I/O bus 158 and various register blocks 160-168.

In general, MRAM control logic block 152 may control a variety of functions including, but not limited to, chip power management, address decoding and signal translation (if necessary). For example, MRAM control logic block 152 may receive signals from Power Management block 154 for controlling the amount of power supplied to components within memory architecture 100. In some cases, Power Management block 154 may include a Low Voltage Detection circuit (not shown) for indicating when an external voltage supplied to memory architecture 100 falls below a predetermined minimum value. A signal indicating a low voltage condition may then be used by MRAM control logic block 152 to indicate that the data may be unreliable (since a certain voltage level is generally required to reliably store data to an MRAM cell), and therefore, should not be written to the MRAM array. In some cases, Power Management block 154 may also conserve power by disabling one or more memory architecture components when not in use (such as, e.g., the I/O buffers and pull-up/pull-down resistors within I/O block 110).

As noted above, MRAM interface 150 may be uniquely configured for accessing the MRAM array using signals intended for the MRAM array, as well as signals intended for accessing a substantially different type of memory (e.g., a NAND Flash, NOR Flash or Compact Flash memory device). As shown in FIG. 2, MRAM control logic block 152 may be configured for receiving MRAM-related command, address and data signals from I/O block 110, or alternatively, for receiving Flash-related signals from one of the conventional Flash memory interfaces (120, 130, 140) included within the device.

If the received signals are Flash-related, MRAM control logic block 152 may translate the received signals into a format recognized by MRAM cell array 180. The translated signals may then be used to generate row and column decoder information 156 for accessing an addressed portion of MRAM cell array 180. In one embodiment, signal translation may be performed by a command processing unit included within command register 160. For example, the command processing unit may include hardware and/or software implemented "wrapper logic," for converting the Flash-related signals (e.g., the I/O, CE#, CLE, ALE, WE#, RE#, R/B#, WP# signals typically associated with a NAND interface) into signals associated with the MRAM array (e.g., I/O, CE#, WE#, RE#, R/B#, WP# and CMD<1:0>). Some conventional Flash interfaces (e.g., NAND Flash and Compact Flash) may access only one block (typically 512 Bytes) of memory at a time. By translating the Flash-related signals into a format recognized by MRAM cell array 180, the smart MRAM interface may be used to access multiple blocks of memory at a time.

If the received signals are MRAM-related, MRAM control logic block 152 may use the received signals to generate row and column decoder information 156 for accessing an addressed portion of MRAM cell array 180. In general, the received signals may be used for accessing multiple blocks of memory at a time. In some cases, MRAM control logic block 152 may be configured for accessing a rather large memory space (e.g., up to about 4 GB, or more) using a special command sequence and a counter included within address register 162. In one embodiment, the counter included within address register 162 may be incremented upon receiving every 8-bits, 16-bits or 32-bits of data, depending on the particular interface option chosen for MRAM interface 150. For example, the internal counter may be incremented upon receiving every 32 bits of data when MRAM interface 150 includes a 32-bit data path. To access multiple blocks of memory at a time, a special command sequence may be employed to repeat a particular cycle (e.g., a command, read or write cycle) numerous times. For example, a 32-bit interface may utilize 64-bit addressing (and therefore, may access about 4 GB of addressable memory space at a time) by repeating command, read and write cycles over successive bus cycles. Exemplary signals used in the special command sequence are shown in FIG. 3 and described in more detail below.

In one embodiment, smart MRAM interface 150 may be configured for receiving various signals including, but not limited to, a chip enable signal (CE#), a read enable signal (RE#), a write enable signal (WE#), a command sequencing signal (CMD) and a plurality of I/O signals (e.g., 16 or 32 bits). The RE# and WE# signals enable data to be read from and written to an addressed portion of the memory cell array. The CE# signal is used to distinguish between command cycles and read/write cycles. In one example, the CE# signal may be held low for read/write cycles and high for command cycles; however, the opposite may be true in other embodiments of the invention. In some cases, a write protect (WP#) signal may also be supplied to the MRAM interface to protect the memory device from accidental programming.

III. COMMAND SEQUENCING FOR THE SMART MRAM INTERFACE

The command sequencing signal (CMD) may be used to provide MRAM interface 150 with extended addressing capabilities (e.g., up to 64-bits, or more) by controlling the direction of data flow on I/O bus 158. In some cases, the command sequencing signal may be a 2-bit signal, CMD<1:0>, as described in the table shown in FIG. 3. For example, if extended addressing is desired for a read or write operation, MRAM control logic block 152 may activate an auto-increment function by setting the CMD signal bits equal to '00'. When CMD<1:0>=B'00', the internal address stored within address register 162 will be auto-incremented after each N-bits of data is read from (or written to) the addressed memory space (where N is substantially equal to the width of the data bus). The data read or write cycle may be repeated to access the next block of data in the addressed memory space as long as the CMD signal bits remain equal to '00'. In other words, the auto-increment function may enable the MRAM interface 150 to access multiple blocks of memory at a time by repeating a data read/write cycle over one or more successive bus cycles.

During a read or write operation, the CMD signal bits may be set equal to '01' for latching the "N" least significant bits (LSBs) of the address, where "N" is substantially equal to the width of the data bus. For example, if the MRAM interface comprises a 32-bit data bus, the CMD signal bits may be set equal to '01' for sending the least significant 32-bits of the address to row and column decoder 156. If extended addressing is desired, the CMD signal bits may be set equal to '10' for sending the next 32-bits of the address to row and column decoder 156, until all addressing bits have been latched. In some cases, the most significant bits (MSBs) of the address may be latched first by setting CMD<1:0>=B'10.' The CMD signal bits may then be set to '01' for latching the next most significant bits, until all addressing bits have been latched.

In some cases, the CMD signal bits may be set equal to '01' for returning ID data during a read cycle. The ID data may be stored within ID register 166 and may include information about the memory device, such as device manufacturer, device ID, memory size, memory type, etc. In some cases, the CMD signal bits may be set equal to '01' for supplying command data to command register 160 during a write cycle. The command data for each interface may be stored within control register 168. After a particular interface is selected, the command data pertaining to the selected interface may be supplied to the command processing unit within command register 160.

As shown in FIG. 3, the CMD signal bits may be set equal to '11' for sending commands to the memory array during a write operation, or for returning status data from status register 164 during a read operation. For example, the CML signal pins may be set to "11" during a write operation to select a particular memory drive for access (e.g., by selecting a particular Device ID number) and/or to enable a reduced pin count (RPC) configuration mode. As shown in FIGS. 4 and 5, the MRAM interface may support 16-bit (RPC16) and 32-bit (RPC32) reduced pin count operations. In 32-bit RPC mode, the MRAM interface will support the address of 2^64 double-words (double-word is 4 bytes). In 16-bit RPC mode, the MRAM interface will support the address of 2^42 words (word is 2 bytes). Examples of status data that may be returned from status register 164 during a read operation may include "command success," "command fail," "write protect enable," and "low voltage detect" signals, among others. The status data may be used by certain interfaces (e.g., the NAND Flash, CF Flash and smart MRAM interfaces) to relay the operational status of the memory device to a user of the memory device. If a problem occurs, the user can obtain the status data to investigate the problem.

An exemplary write cycle programming operation for a 32-bit RPC MRAM interface is described herein to illustrate how the command sequencing bits, CMD<1:0>, may be used to access multiple memory blocks (e.g., 2^64 memory blocks of 32-bits each) at a time. During a first command write cycle, the command sequencing bits may be set equal to CMD<1:0>=B'11,' with IO<31:0>=0xXXXX0102, to enable a RPC32 configuration mode. During a second command write cycle, the command sequencing bits may be set equal to CMD<1:0>=B'11,' with IO<31:0>=0, to select a particular memory drive (e.g., Device ID=0) to be accessed. Additional command write cycles may then be performed for latching, e.g., a 64-bit address. In one embodiment, a third command write cycle may be performed with CMD<1:0>=B'10' and IO<31:0>=address<63:32> for latching the most significant bits of the 64-bit address. The least significant bits may then be latched in a fourth command write cycle by setting CMD<1:0>=B'01' and IO<31:0>=address<31:0>.

After the appropriate commands are sent to the memory array, a plurality of data write cycles may be performed in succession to transfer the data from I/O pins [31:0] to memory blocks residing within the addressed portion of the memory array. For example, a first data write cycle may be performed to write a first block of data (DATA0) to the memory array by setting CMD<1:0>=B'00' when IO<31:0>=<DATA0>. The next block of data (DATA1) may be written during a second data write cycle by maintaining CMD<1:0>=B'00' when IO<31:0>=<DATA1>. The process may continue until the last block of data (DATAM) is supplied to the I/O pins during an $M^{th}$ data write cycle with CMD<1:0>=B'00'. In this manner, data supplied to the I/O pins can be stored to another memory block within the addressed portion of the memory array during each data write cycle. Once each block of data is written, the counter within address register 162 will be auto-incremented to point to the location at which the next block of data is to be written to memory.

An exemplary read cycle programming operation for a 32-bit RPC MRAM interface is also described herein. Like the write operation described above, the read operation described below may be used to access 2^64 memory blocks (of 32-bits each) during successive data read cycles. As such, the read operation may begin by selecting a memory drive to be accessed (e.g., Device ID=0) by setting CMD<1:0>=B'11' and IO<31:0>=0 during a first command cycle. Next, a 64-bit address may be latched, in one embodiment, during one or more subsequent command write cycles. For example, a second command write cycle may be performed with CMD<1:0>=B'10' and IO<31:0>=address<63:32> for latching the most significant bits of the 64-bit address. The least significant bits may then be latched during a third command write cycle by setting CMD<1:0>=B'01' and IO<31:0>=address<31:0>.

After the appropriate commands are sent to the memory array, a plurality of data read cycles may be performed in succession for transferring stored data to I/O pins [31:0]. For example, a first data read cycle may be performed for obtaining a first block of data (DATA0) from the memory array by setting CMD<1:0>=B'00'. The first block of data may then be output from the memory device by supplying DATA0 to I/O pins [31:0]. The next block of data (DATA1) may be read from the memory array during a second data read cycle by maintaining CMD<1:0>=B'00' and supplying DATA0 to I/O pins [31:0]. The process may continue until the last block of data (DATAM) is read from the memory array during an $M^{th}$ data read cycle with CMD<1:0>=B'00.'. In this manner, a block of data may be read from the memory array and output to IO<31:0> pins once per bus cycle. After each block of data is read, the address stored within address register 162 will be auto-incremented to point to the location of the next block of data to be read.

By using the command sequencing operation described above, smart MRAM interface 150 provides a flexible way for accessing memory blocks without being limited to a 512-byte memory sector (as in conventional NAND Flash and CF devices). The smart MRAM interface further comprises an easy interface to the memory bus, and auto increments on every data cycle to access multiple blocks of memory at a time. Furthermore, the smart MRAM interface provides full support with command/data/status information, which could make the MRAM interface extremely useful for a high reliability file storage system.

IV. EXEMPLARY INTERFACE OPTIONS AND MEANS FOR SELECTING

As noted above, configuration block 170 may be used to selectively activate at least one memory interface block (120, 130, 140, 150) for accessing the MRAM array (180). Activation may be performed by a manufacturer of the memory device during packaging, or by a user of the memory device sometime thereafter. In addition, the selection process may be a static, manual or dynamic process performed through various hardwired or programmable means. During a static process, for example, a manufacturer of the memory device may selectively activate at least one of the memory interface blocks by using hardwired means (e.g., downbonding) to make the appropriate connections between I/O block 110 and the inputs of the selected interface. A manual process, on the other hand, may be performed by a user of the memory device for selectively activating at least one of the memory interface blocks via programmable means (e.g., programmable fuses, multiplexers or software-implemented logic). The manual process may be performed one or more times, as desired. In some cases, a dynamic process may be used to selectively activate at least one of the memory interface blocks via programmable means. For example, one or more memory interface blocks may be selected depending on the format of the command signals received by I/O block 110. If, for example, the command signals received by I/O block 110 are formatted for accessing a Flash memory device, the appropriate Flash memory interface (120, 130, 140) may be automatically selected in the dynamic process. Alternative means for selectively activating at least one memory interface block may be used in other embodiments of the invention.

Once an interface block is selected, configuration block 170 may couple the I/O pins of I/O block 110 to the appropriate inputs of the selected interface. In some embodiments, configuration block 170 may include a software-implemented table (not shown) for determining the appropriate mappings between I/O block 110 and the selected interface block. Exemplary I/O pin configurations for MRAM interface 150 and Flash interfaces 120, 130, 140 will now be described in reference to FIGS. 4-7.

FIGS. 4 and 5 illustrate exemplary I/O pin configurations for a 28-pin and a 48-pin MRAM interface, respectively. FIGS. 6 and 7 illustrate exemplary I/O pin configurations for conventional 48-pin NAND, NOR and Compact Flash memory interfaces. The pin configurations shown in FIGS. 4-7 may be used by configuration block 170 to determine the appropriate I/O mapping between I/O block 110 and a selected memory interface block. Though 48-pin configurations are primarily shown in the figures, the number of pins required to implement a particular memory interface may be substantially smaller or larger, depending on certain design specifications and/or trade-offs. For example, and as described in more detail below, the NOR interface of FIG. 7 may be modified to include a substantially greater number of pins, if cost and chip real estate is of little to no concern.

More specifically, FIGS. 4 and 5 show exemplary I/O pin configurations for a 28-pin smart MRAM interface with a 16-bit data path, and a 48-pin smart MRAM interface with a 32-bit data path, respectively. As such, smart MRAM interface 150 may include a plurality of I/O pins (e.g., 16 or 32) for receiving data and address signals, along with a number of dedicated pins for receiving various command, power (VCC) and ground (VSS) signals. The command signal inputs are described above as including a chip enable signal (CE#), a read enable signal (RE#), a write enable signal (WE#), a write protect signal (WP#) and a special command sequencing signal (CMD). As noted above, the special command sequencing signal may be used to access multiple blocks of memory over successive bus cycles by repeating a data read or write cycle numerous times. For example, if the smart MRAM interface is configured for 64-bit addressing, the special command sequencing signal may be used to access $2^{64}$ blocks of memory during successive data read or write cycles. It is noted, however, that 64-bit addressing is used herein merely as an example, and that one skilled in the art would readily understand how the smart MRAM interface could be modified to support smaller or larger addressing modes. Reduced pin count configurations (e.g., RPC16 and RPC32) are also provided in FIGS. 4 and 5 for the smart MRAM interface. These configurations enable the interface to access the same amount of memory with a reduced number of I/O pins.

FIG. 6 shows an exemplary I/O pin configuration for a 48-pin NAND Flash memory interface with 8-bit, 16-bit and 32-bit data paths. As shown, the NAND Flash interface may include a plurality of I/O pins (e.g., 8, 16 or 32) for receiving data and address signals, along with a number of dedicated pins for receiving various command, power (VCC) and ground (VSS) signals. The command signal inputs are generally known in the art, and therefore, require no further description herein. However, it is worth noting that the NAND Flash interface may support up to 64-bit addressing through the use of a dedicated Address Latch Enable signal, ALE, which enables the address to be latched multiple times. Reduced pin count configurations (e.g., RPC16 and RPC32) are also provided in FIG. 6 for the NAND Flash interface.

An exemplary input configuration for a 48-pin Compact Flash (CF) memory interface with a 16-bit data path is also shown in FIG. 6. As shown, the CF interface may include a plurality of data pins (e.g., IO0-IO15) and a plurality of address pins (e.g., A0-A10), along with a number of dedicated pins for receiving various command, power (VCC) and ground (VSS) signals. Like the NAND Flash interface, the CF interface may also support up to 64-bit addressing.

FIG. 7 shows an exemplary I/O pin configuration for a 48-pin NOR Flash memory interface with a 16-bit data path. Similar to the CF interface, the NOR Flash interface includes a plurality of data pins (e.g., D0-D15) and a plurality of address pins (e.g., A0-A19), along with a number of dedicated pins for receiving various command, power (VCC) and ground (VSS) signals. Unlike the NAND and CF interfaces, however, the 48-pin NOR interface of FIG. 7 may only support up to 32-bit addressing. Though larger addressing capability may be provided by increasing the number of pins associated with the NOR interface, cost and/or space concerns may dissuade a system designer or manufacturer from doing so.

V. CONCLUSIONS

The universal multi-function MRAM device described herein provides many advantages over conventional, single-function memory devices. For example, the universal memory architecture described herein may be used to provide a low cost solution for multiple memory products by saving overhead and resources. In other words, the universal memory architecture may eliminate the need to keep multiple memory products in inventory by providing an architecture that can be selectively activated to emulate various types of memory. In addition, the universal memory architecture may provide a simple and cost effective solution for upgrading or changing a system memory device to a different type of memory. In one example, the universal memory architecture may be used to replace existing NAND Flash, NOR Flash and Compact Flash memory devices without changing existing system hardware/software. The multi-function MRAM device also provides the additional advantages of a reduced pin count (RPC) smart MRAM interface, which allows extended memory addressing and static/dynamic configuration of the smart MRAM interface via hardware/software selection.

For purposes of clarity, many of the details of the multi-function MRAM device and the methods of designing and manufacturing the same that are widely known and are not relevant to the present invention have been omitted from the foregoing description. It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment," "one embodiment," or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purposes of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects may lie in less than all features of a single foregoing disclosed embodiment. Thus, the claims following the detailed description are hereby expressly incorporated into this detailed description, with each claim standing on its own as a separate embodiment of this invention.

What is claimed is:

1. A memory circuit architecture, comprising:
   a magnetic random access memory (MRAM) array; and
   a plurality of memory interface blocks, each configured for accessing a different type of memory array, wherein one of the plurality of memory interface blocks is configured for:
   using a first set of commands received by the memory circuit architecture to access the MRAM array; and
   translating a second set of commands received by the memory circuit architecture into a format recognized by the MRAM array and using the translated commands to access the MRAM array.

2. The memory circuit architecture of claim 1, wherein the plurality of memory interface blocks comprise one or more interface blocks selected from a group consisting of: a NAND Flash interface, a NOR Flash interface, a Compact Flash (CF) interface, and various types of Random Access Memory (RAM) and Read Only Memory (ROM) interfaces.

3. The memory circuit architecture of claim 2, wherein the plurality of memory interface blocks comprise a NAND Flash interface, a NOR Flash interface, and a Compact Flash (CF) interface.

4. The memory circuit architecture of claim 3, wherein the one of the plurality of memory interface blocks comprises a Magnetic Random Access Memory (MRAM) interface coupled for receiving the first set of commands, which are intended for accessing the MRAM array, as well as the second set of commands, which were initially intended for accessing a different type of memory array.

5. The memory circuit architecture of claim 4, further comprising:
   an input/output (I/O) block coupled for receiving the first set of commands or the second sets of commands from an external source; and
   a configuration block configured for selectively activating at least one of the plurality of memory interface blocks for accessing the MRAM array.

6. The memory circuit architecture of claim 5, wherein the configuration block is configured for activating the at least one of the plurality of memory interface blocks via hardwired or programmable means.

7. The memory circuit architecture of claim 6, wherein the programmable means comprise software-implemented logic or programmable fuses.

8. The memory circuit architecture of claim 6, wherein the configuration block is configured for activating the MRAM interface and deactivating all other interface blocks during times in which the first set of commands are received by the memory circuit architecture.

9. The memory circuit architecture of claim 6, wherein the configuration block is configured for activating another memory interface along with the MRAM interface, and deactivating all other interface blocks, during times in which the second set of commands are received by the memory circuit architecture.

10. The memory circuit architecture of claim 9, wherein the MRAM interface comprises logic, in the form of hardware and/or software, for translating the second set of commands into the format recognized by the MRAM array.

11. The memory circuit architecture of claim 10, wherein the MRAM interface enables the memory circuit architecture to emulate different types of memory arrays, while utilizing desired features of the MRAM array.

12. The memory circuit architecture of claim 11, wherein the desired features comprise less complex programming, faster and more reliable read/write operations, and decreased power consumption, as compared to conventional Flash memory arrays.

13. A memory product, comprising:
   a magnetic random access memory (MRAM) array;
   at least one memory interface block configured for accessing a different type of memory array other than the MRAM array, wherein the at least one memory interface block is selected from a group consisting of: a NAND Flash interface, a NOR Flash interface, a Compact Flash (CF) interface, and various types of Random Access Memory (RAM) and Read Only Memory (ROM) interfaces; and a MRAM interface block coupled between the at least one memory interface block and the MRAM array, wherein the MRAM interface block is configured for accessing the MRAM array using commands intended for the MRAM array, as well as commands intended for the different type of memory array.

14. The memory product of claim 13, wherein the MRAM array, the at least one memory interface block and the MRAM interface block are all incorporated within a single package, which can be used to replace other memory products previously existing within a system without making any hardware/software changes to the system layout or operation.

15. A method for operating a memory circuit including a magnetic random access memory (MRAM) array, the method comprising:

receiving a first set of commands corresponding to one of a plurality of memory interface blocks included within the memory circuit for accessing the MRAM array; and translating a second set of commands into a format recognized by the MRAM array and using the translated commands to access the MRAM array, if the second set of commands are initially formatted for accessing a type of memory array other than the MRAM array.

16. The method of claim 15, further comprising using the first set of commands to access the MRAM, if the received commands are initially formatted for accessing the MRAM array.

17. The method of claim 16, wherein the plurality of memory interface blocks comprise two or more interface blocks selected from a group consisting of: a MRAM interface, a NAND Flash interface, a NOR Flash interface, a Compact Flash (CF) interface, and various types of Random Access Memory (RAM) and Read Only Memory (ROM) interfaces.

18. The method of claim 17, further comprising selecting at least one of the plurality of memory interface blocks to be used for accessing the MRAM array.

19. The method of claim 18, wherein the step of selecting is a static process performed only once before the step of receiving.

20. The method of claim 18, wherein the step of selecting is a manual process performed one or more times by a user of the memory circuit.

21. The method of claim 18, wherein the step of selecting is a dynamic process dependent on a particular format of the received commands.

22. The method of claim 18, further comprising receiving a command sequencing signal along with the received commands to determine an operational mode of the memory circuit.

23. The method of claim 22, further comprising using the command sequencing signal to select the operational mode from a plurality of operational modes comprising a device selection mode, a reduced pin count mode and an extended addressing mode.

24. The method of claim 22, further comprising using the command sequencing signal to obtain status and identification information from a storage element arranged within the memory circuit.

25. The method of claim 22, further comprising using command sequencing signal to supply commands associated with a selected memory interface block to a command processing unit arranged within the memory circuit.

\* \* \* \* \*